United States Patent [19]

Iga et al.

[11] Patent Number: 5,091,756
[45] Date of Patent: Feb. 25, 1992

[54] SUPERLATTICE STRUCTURE

[75] Inventors: Kenichi Iga; Fumio Koyama; Hiroyuki Uenohara, all of Tokyo, Japan

[73] Assignee: Tokyo Institute of Technology, Tokyo, Japan

[21] Appl. No.: 501,291

[22] Filed: Mar. 19, 1990

Related U.S. Application Data

[63] Continuation of Ser. No. 256,245, Sep. 30, 1988, abandoned, which is a continuation of Ser. No. 12,422, Feb. 16, 1987, abandoned.

[30] Foreign Application Priority Data

Aug. 14, 1989 [JP] Japan ................. 61-189623

[51] Int. Cl.$^5$ .............. H01L 27/12; H01L 29/161; H01L 33/00
[52] U.S. Cl. .......................... 357/4; 357/16; 357/17; 372/45
[58] Field of Search ............ 357/4, 4 SL, 16, 17; 372/45

[56] References Cited

U.S. PATENT DOCUMENTS

| | | | |
|---|---|---|---|
| 4,163,237 | 7/1979 | Dingle et al. | 357/16 |
| 4,511,408 | 4/1985 | Holonyak, Jr. | 357/16 |
| 4,599,728 | 7/1986 | Alavi et al. | 357/61 |
| 4,620,206 | 10/1986 | Ohta et al. | 357/16 |
| 4,654,090 | 3/1987 | Burnham et al. | 357/91 |
| 4,705,361 | 11/1987 | Frazier et al. | 357/16 |
| 4,712,121 | 12/1987 | Yokoyama | 357/34 |
| 4,786,957 | 11/1988 | Mato | 357/16 |
| 4,796,067 | 1/1989 | Shimiza et al. | 357/4 |

OTHER PUBLICATIONS

Miller et al., "Parabolic Quantum Wells with the GaAs-Al$_x$Ga$_{1-x}$As System", vol. 29, No. 6, pp. 3740 to 3743, 1984, the American Physical Society.

Primary Examiner—Andrew J. James
Assistant Examiner—Ngan Van Ngo
Attorney, Agent, or Firm—Spencer & Frank

[57] ABSTRACT

A superlattice structure composed of at least two kinds of crystal layers, such as semiconductor layers, being different in bandgap, being combined alternately with each others, and the physical parameters of the layers being designed so that phase differences of reflected waves of injected electrons or holes are substantially equal to $\pi$ multiplied by an odd numbered integer so that the energy potential barrier height is effectively increased. When used in semiconductor lasers, it allows the confining efficiency of injected carriers to be noticeably improved.

3 Claims, 4 Drawing Sheets

FIG_1
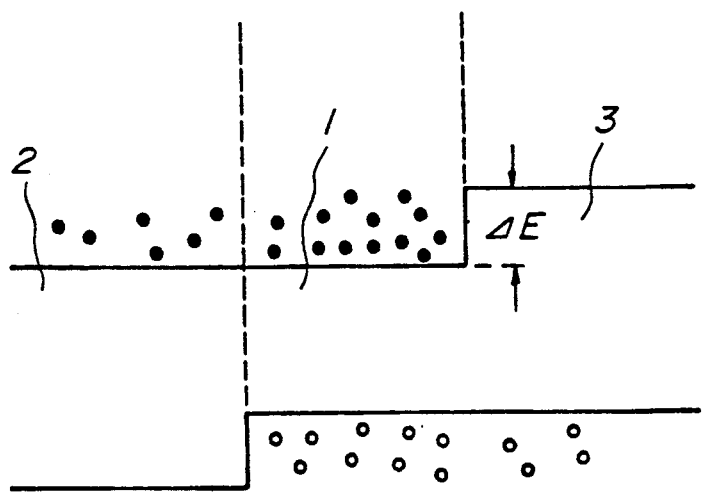
PRIOR ART
FIG_2a
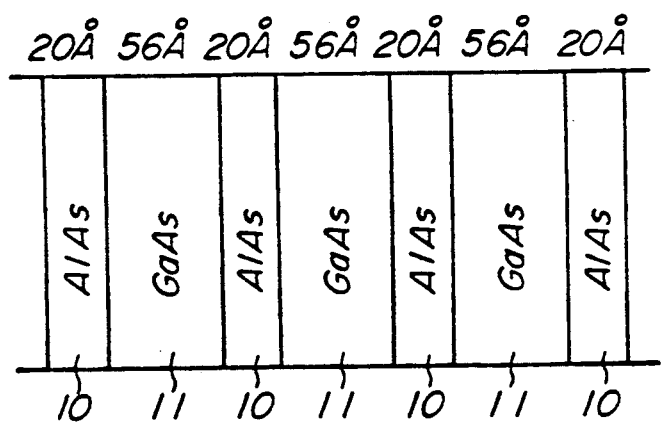
FIG_2b

FIG_5a
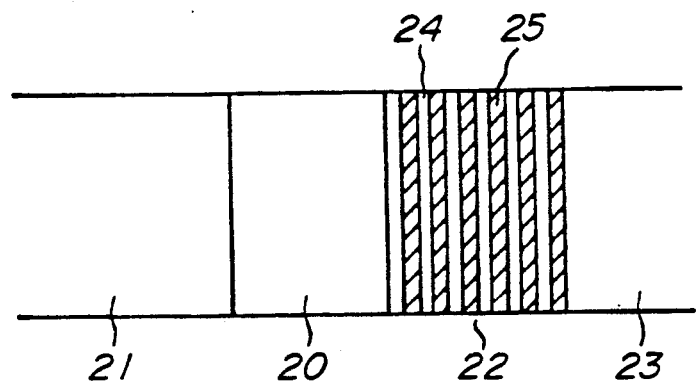
FIG_5b
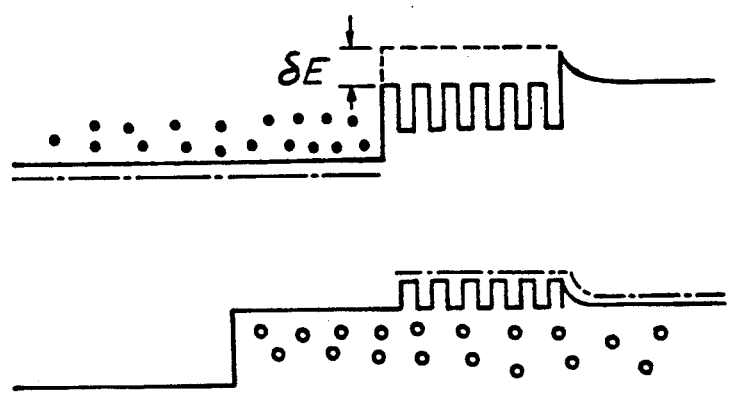

SUPERLATTICE STRUCTURE

This application is a continuation of application Ser. No. 07/256,245, filed Sept. 30th, 1988, which is a continuation of application Ser. No. 07/012,422, filed Feb. 6th, 1987, both now abandoned.

BACKGROUND OF THE INVENTION

1. Field of the Invention

This invention relates to a superlattice structure with an artificially controllable potential energy barrier.

2. Description of the Prior Art

For light emitting semiconductor devices, such as semiconductor lasers, light emitting diodes, etc., it is required to effectively confine injected carriers, such as electrons or holes, contributing to the light emission within an active region. In conventional light emitting semiconductor devices, therefore, a double heterostructure as shown in FIG. 1 is employed which is formed with an n-type cladding region 2 on one side and a p-type cladding region 3 on the other side of a p-type active region 1, respectively, said p-type active region 1 and p-type cladding region 3 being made of mutually different semiconductive materials to provide a difference $\Delta E$ of band gap energy between regions 3 and 1. In such a light emitting semiconductor device, the effective height of the energy potential barrier for confined electrons or holes is the difference $\Delta E$ of the band gap energies which is determined by material constants inherent in the semiconductor materials of active region 1 and p-type cladding region 3.

On the other hand, with the recent advance of crystal growing technology, such as MBE (molecular beam epitaxy) processes, MOCVD (metal-organic chemical vapor deposition) processes, etc., the crystal growth of super thin layers on the order of an atomic layer has become feasible and property control of semiconductor devices has been effected by making use of a quantum size effect. For example, in a quantum well laser with an active layer several tens of angstroms thick, reduction of the threshold current and shortening of the light emission wave-length have been contemplated with an increase in the state density function due to the dispersion of the energy levels of the electrons and holes in the quantum wells. Further, it has been proposed that, as an electron device, a CHIRP (Coherent Hetero Interface for Reflection and Penetration) superlattice be utilized which has a base region composed of two kinds of semiconductor materials different in band gap, alternately arranged with their periodicity varied little by little.

The aforementioned conventional light emitting devices have a disadvantage such that, if they are operated at high temperatures, the electrons and holes are thermally excited to high energy levels so that these carriers, such as electrons and holes, leak out over the potential barrier, whereby the light emission efficiency is noticeably lowered. They have a further disadvantage such that, when they are used as a laser, the threshold current increases. Furthermore, for example, GaInAsP lasers emitting in the wavelength region of 1.5 $\mu$m have a shortcoming such that some carriers leak out at high temperatures via the Auger process so that operation at high temperature is difficult. These problems are caused by insufficient formation of effective energy potential barriers for electrons and holes.

On the other hand, with the advance of membrane forming technology, superlattice structures of various characteristics have been developed which are expected to be utilized in light emitting devices. However, the above-mentioned superlattice structures have so far been utilized only as electronic devices, and the technology for confining electrons and holes in an active region for light emitting devices by making use of superlattice structures has not yet been developed.

SUMMARY OF THE INVENTION

Accordingly, it is an object of the present invention to provide a novel superlattice structure which can give an energy potential barrier whose effective height can be virtually controlled so as to permit efficacious confinement of injected electrons or holes within an active region, particularly in the case where the structure is used as a light emitting device.

The above object will be achieved by a superlattice structure according to the present invention which is characterized by comprising a combination of alternating at least two kinds of crystal layers differing in band gap and having respective thicknesses designed in such a manner that the phase difference of reflected waves of injected electrons or holes is substantially n multiplied by an odd numbered integer.

BRIEF DESCRIPTION OF THE DRAWING

FIG. 1 is a schematic energy band diagram of a conventional semiconductor laser.

FIGS. 2a, 2b and 2c are schematic diagrams illustrating a structure and profiles of the band system, respectively, of an embodiment of the present invention;

FIGS. 5a and 5b are schematic diagrams illustrating a structure and a profile of the band system, respectively of a further embodiment wherein a superlattice structure according to the invention is applied to a semiconductor laser.

DETAILED DESCRIPTION OF THE INVENTION

Figure 2C:
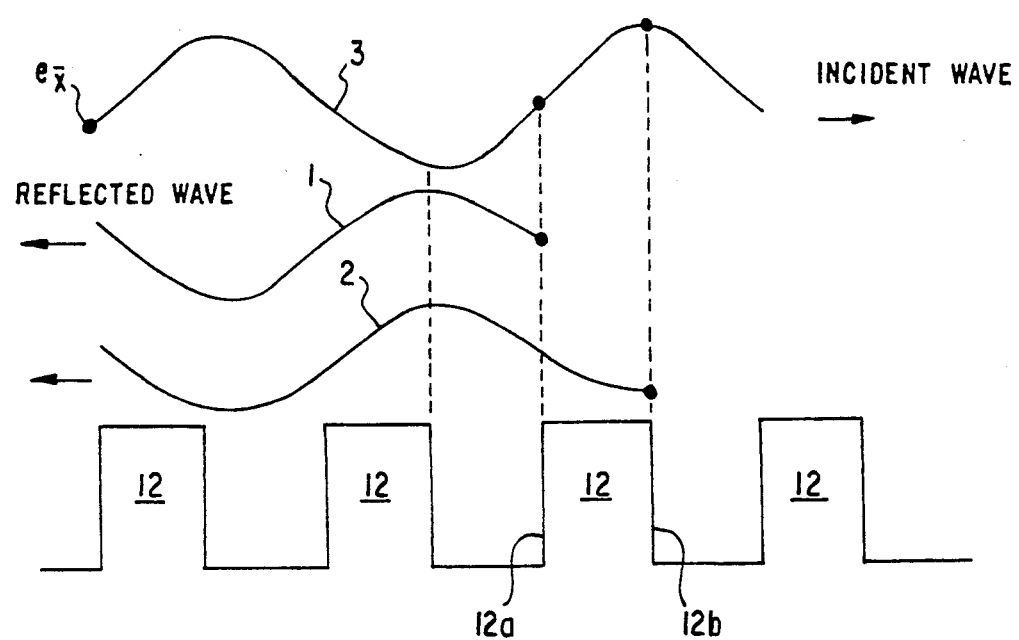

A superlattice structure is composed by combining semiconductor 1 of thickness $d_1$ and electron affinity $X_1$ alternately with semiconductor 2 of thickness $d_2$ and electron affinity $X_2$. This superlattice has a conduction band having a base which varies periodically with an amplitude of: $\Delta E_c = X_1 - X_2$. On the other hand, when an electron having energy E is injected into this superlattice, the electron is reflected quantum-mechanically at potential discontinuities, i.e., an interface between semiconductor 1 and semiconductor 2. Accordingly, if the physical parameters of semiconductors 1 and 2 are pertinently designed so that phase differences of reflected waves of injected electrons can be controlled, effective energy potential barriers against injected electrons become able to be controlled virtually. In the present invention, thicknesses $d_1$ and $d_2$ respectively of semiconductors 1 and 2 constituting the superlattice and energy values E for enhancing reflection are determined to satisfy the following equations.

$$(2m_1{}^* \cdot E)^{\frac{1}{2}} \cdot d_1/h = \frac{2l-1}{4} \quad (1)$$

where, $l = 1, 2, 3, \ldots$ $$\{2m_2{}^*(E - \Delta E_c)\}^{\frac{1}{2}} \cdot d_2/h = \frac{2k-1}{4} \quad (2)$$

where, $k = 1, 2, 3, \ldots$

Here, $m^*_1$ and $m^*_2$ are effective masses of electrons in semiconductors 1 and 2, respectively, and h is Planck's constant. If each physical parameter of semiconductors 1 and 2 is designed so that the equations (1) and (2) are satisfied, namely, so that phase differences of reflected electron waves are n multiplied by odd numbered integers, phases of the reflected waves enhance mutually at each discontinuity and the superlattice reflects the injected electrons with a particular energy, so that energy potential barriers against electrons are equivalently heightened.

However, since, under usual crystal growing conditions, the thickness of the layer can be only an integer times the thickness of the monatomic layer, the thickness nearest the value obtained from the equations (1) and (2) is taken in practice.

Additionally, though the above explanation has been given of electrons in a conduction band, it also may be applied to holes in a valence band.

In the accompanying drawing, FIGS. 2a, 2b and 2c show schematically an embodiment of the superlattice structure according to the invention, FIG. 2a being a schematic diagram and FIGS. 2b and 2c being diagrams illustrating the profile of a conduction band. In this embodiment, AlAs layers 20Å thick were used as first semiconductive material layers 10 having a large band gap, while GaAs layers 56 Å thick were used as second semiconductive layers 11. Then, AlAs layers 10 and GaAs layers 11 were combined alternately with each other to compose a superlattice structure. This superlattice structure may be manufactured by means of crystal growing technology, such as MBE processes and the like. Electrons injected into this superlattice structure (FIG. 2c) and being in a conduction band see a periodic potential as high as electron affinity difference $\Delta E_c$ between the AlAs layer 10 and the GaAs layer 11, and thus an energy potential barrier, for example, of 0.956 eV in this embodiment, is formed. Thicknesses and electron affinities of the first and second semiconductive materials 10 and 11 satisfy the aforementioned equations (1) and (2), respectively, and phases of the reflected electron waves (mass waves) at each interface are mutually enhanced, so that injected electrons in the conduction band are reflected intensely. Thus, in FIG. 2c, three mass wave forms of an individual incident electron mass wave of electron $e\bar{x}$ are shown. Reflected wave 1 of electron $e\bar{x}$ is shown as reflected from front interface 12a of one potential energy barrier 12. Reflected wave 1 does not shift its phase but is inverted at the reflection point along front interface 12a compared to incident wave 1 of electron $e,\bar{x}$. Alternately, reflected wave 2 of electron $e\bar{x}$ is shown as reflected from rear interface 12b of the same potential energy barrier 12. Here, the phase shifts by $\pi$ so that reflected wave 2 is inverted as shown. A phase difference is therefore created for each individual electron $e\bar{x}$ between reflected wave 1 reflected from front interface 12a and reflected wave 2 reflected from rear interface 12b by propagation of reflected wave 2 from rear interface 12b to front interface 12a, which phase difference is equal to n multiplied by an odd numbered integer. Thus, reflected waves 1 and 2 enhance each other.

Figure 3A:
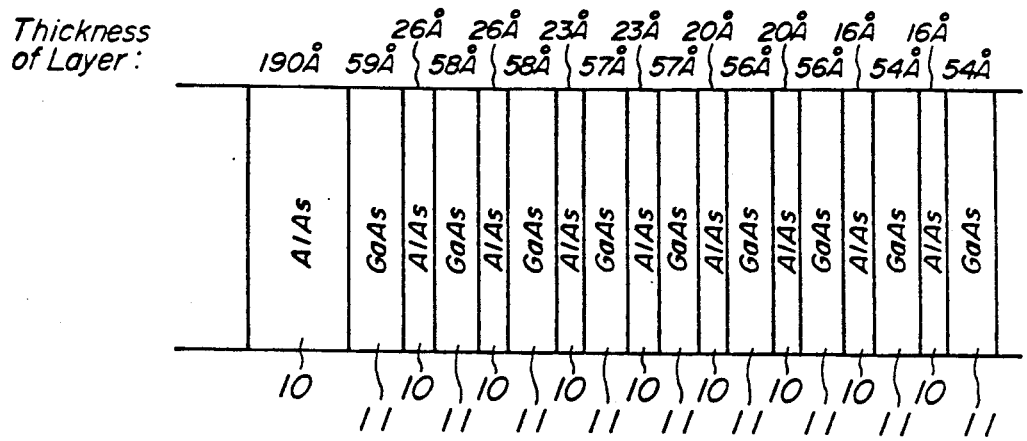
FIGS. 3a and 3b are also schematic diagrams illustrating a structure and a profile of the band system, respectively, of another embodiment of the present invention.
Figure 3B:
Figure 4:
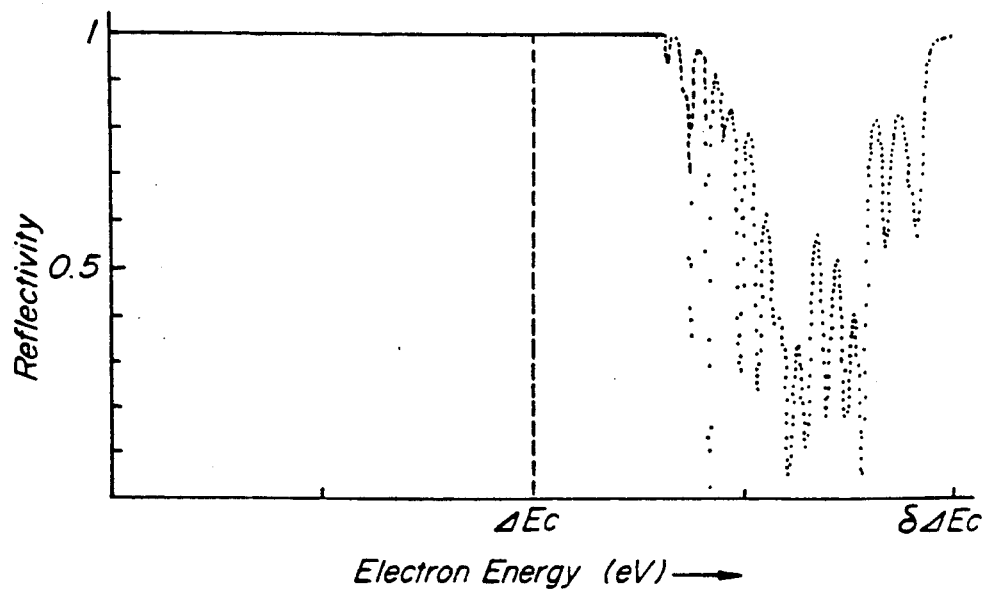
FIG. 4 is a diagram showing an example of calculated reflectivity versus electron energy incident upon the superlattice structure shown in FIG. 3.

FIGS. 3a and 3b are schematic diagrams illustrating a preferred embodiment of the superlattice structure according to the invention. In this embodiment, plural pairs of the first and second semiconductive layers 10 and 11 differing in periodicity are mutually combined. Thus, by varying the periodicity by varying the thicknesses of AlAs layer 10 and GaAs layer 11, a plurality of electrons differing in energy level can be simultaneously reflected intensely. An example of the calculated reflectivity of an electron versus its energy normalized by the barrier height is shown in FIG. 4. The abscissa shows electron energy and the ordinate shows reflectivity. As is clear from FIG. 4, it can be understood that even electrons having a higher energy by about 0.3 eV than the AlAs bulk barrier, are reflected. Thus, if the superlattice structure of the invention is applied to a semiconductor laser, injected carriers can be effectively confined spatially, and thus emitting efficiency can be increased.

FIGS. 5a and 5b illustrate a further embodiment wherein a superlattice structure according to the invention is applied to a GaInAsP/InP semiconductor laser having a wavelength region of 1.5 m. By one side of a GaInAsP active layer 20 of 1.55 μm composition doped into n-type, is formed an n-type InP cladding layer 21, while, by the other side, is formed multi-superlattice 22 according to the present invention. Further, p-type InP cladding layer 23 is formed by the other side of multi-superlattice 22. Multi-superlattice 22 has a combination structure of alternating GaInAsP layer 24 and InP layer 25. If multi-superlattice 22 is formed, as above, between n-type active layer 20 and p-type cladding layer 23, the effective potential barrier height can be increased by $\delta E$ as shown in FIG. 5b, whereby injected electrons can be confined more effectively within the active layer. Whereas, with regard to prior art semiconductor lasers of such a wavelength region, an inconvenience has been pointed out that electrons scatter via the Auger process towards the high energy side leak out over the barrier of the double heterostructure, so that thermal characteristics are deteriorated, the superlattice structure of the present invention allows the potential barrier height to increase by $\delta E$, whereby thermal characteristics of the threshold current can be improved.

The embodiments of the invention described hereinabove are illustrative and not restrictive. Further, various alterations and modifications can be made by those skilled in the art, without departing from the scope of the present invention, for instance, though $Ga_{1-x}Al_xAs$ was used in the explanation of the foregoing examples, various other mixed crystal materials, such as InGaAsP, GaAlAsSb, etc. can be employed. Furthermore, the above-described embodiments were explained using two-layered structures and, however, superlattice structures composed of three or more crystals combined alternately with each other are also employable.

As explained above, in accordance with the present invention, the superlattice structure is composed of at least two kinds of crystal layers being different in band gap and being combined alternately with each other, physical parameters of which layers are determined so that phases of reflected waves of injected electrons or holes may be mutually enhanced, to enable the effective energy potential barrier height to be virtually increased. Consequently, when used in semiconductor lasers, it allows the confining efficiency of injected carriers to be further improved.

Additionally, the combination of plural pairs differing in periodicity allows a plurality of electrons differing in energy to be intensely reflected simultaneously.

What is claimed is:

1. A superlattice structure for receiving injected electrons or holes and having potential energy barriers which confine said injected electrons or holes, said superlattice structure comprising:

a combination of first and second kinds of semiconductor crystal layers which alternate with respect to one another, have respective interfaces therebetween, have different band gap energies, and have different thicknesses $d_1$ and $d_2$ respectively, wherein said first kind of crystal layer defines a potential energy barrier having front and rear interfaces with respect to said second kind of crystal layer, and wherein said respective band gap energies and said respective thicknesses $d_1$ and $d_2$ are selected so that an incident injected electron or hole mass wave is reflected quantum-mechanically as first and second mass waves at respective front and rear interfaces of the potential energy barriers to enhance reflection of said injected electrons or holes with energy E and satisfy the following equations:

$$(2m_1^* \cdot E)^{\frac{1}{2}} \cdot d_1/h = \frac{2l - 1}{4}$$

where $e = 1, 2, 3, \ldots,$ and $$\{2m_2^*(E - \Delta E_c)\}^{\frac{1}{2}} \cdot d_2/h = \frac{2k - 1}{4}$$

where $k = 1, 2, 3, \ldots,$ E is the energy of an injected electron or hole, $m^*1$ and $m^*2$ are effective masses of electrons in said at least two kinds of crystal layers, respectively, $\Delta E$ is the electron affinity difference of said at least two kinds of crystal layers, and h is Planck's constant, said superlattice structure including a first member for receiving said injected electrons or holes, said first member comprising at least one of said first and one of said second crystal layers; and a second member contiguous with said first member comprising a plurality of said first and second crystal layers, the thicknesses of the first and second crystal layers of said second member being less than the thicknesses of said first and second crystal layers respectively of said first member, the thicknesses decreasing in a direction away from the interface between said first and second members;

wherein said first reflected mass wave and said second reflected mass wave have a phase difference therebetween which is created by propagation of said incident mass wave from said front interface to said rear interface and propagation of said second reflected mass wave from said rear interface to said front interface, said phase difference being substantially equal to $\pi$ multiplied by an odd numbered integer, whereby the potential energy barriers of the superlattice structure are heightened.

2. A superlattice structure as claimed in claim 1 wherein said first kind of semiconductor crystal layer comprises AlAs and the second kind of semiconductor crystal layer comprises GaAs.

3. A light emitting device having an active region and the superlattice structure according to claim 1 positioned adjacent to the active region.

* * * * *